United States Patent
Yang et al.

(10) Patent No.: US 7,745,324 B1
(45) Date of Patent: Jun. 29, 2010

(54) INTERCONNECT WITH RECESSED DIELECTRIC ADJACENT A NOBLE METAL CAP

(75) Inventors: Chih-Chao Yang, Glenmont, NY (US); Shyng-Tsong Chen, Rensselaer, NY (US); Baozhen Li, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/351,367

(22) Filed: Jan. 9, 2009

(51) Int. Cl.
*H01L 21/4763* (2006.01)

(52) U.S. Cl. ............... 438/618; 438/614; 438/619; 438/622; 438/628; 438/629; 257/E21.304; 257/E21.576

(58) Field of Classification Search ............... None
See application file for complete search history.

(56) References Cited

U.S. PATENT DOCUMENTS

| | | | |
|---|---|---|---|
| 5,098,860 A | 3/1992 | Chakravorty et al. | |
| 5,930,669 A | 7/1999 | Uzoh | |
| 5,933,753 A | 8/1999 | Simon et al. | |
| 6,345,665 B1 | 2/2002 | Schulz-Harder | |
| 6,383,920 B1 | 5/2002 | Wang et al. | |
| 6,429,519 B1 | 8/2002 | Uzoh | |
| 6,441,492 B1 | 8/2002 | Cunningham | |
| 6,596,640 B1 * | 7/2003 | Fishcer et al. | 438/692 |
| 7,008,871 B2 * | 3/2006 | Andricacos et al. | 438/652 |
| 7,187,085 B2 | 3/2007 | Clevenger et al. | |
| 7,253,098 B2 | 8/2007 | Chen et al. | |
| 7,402,883 B2 | 7/2008 | Yang et al. | |
| 2002/0153554 A1 | 10/2002 | Kajita et al. | |
| 2004/0130027 A1 * | 7/2004 | Chen et al. | 257/758 |
| 2005/0064701 A1 | 3/2005 | Dalton et al. | |
| 2006/0014380 A1 * | 1/2006 | Abe | 438/629 |
| 2006/0019485 A1 | 1/2006 | Komai et al. | |
| 2006/0073695 A1 | 4/2006 | Filippi et al. | |
| 2007/0032062 A1 | 2/2007 | Lee et al. | |
| 2007/0049007 A1 | 3/2007 | Yang et al. | |
| 2007/0096319 A1 | 5/2007 | Hsu et al. | |
| 2007/0117377 A1 | 5/2007 | Yang et al. | |
| 2007/0158717 A1 | 7/2007 | Edelstein et al. | |
| 2007/0161239 A1 | 7/2007 | Murray et al. | |
| 2007/0194450 A1 | 8/2007 | Tyberg et al. | |
| 2007/0196639 A1 | 8/2007 | Gates et al. | |
| 2007/0205482 A1 | 9/2007 | Yang et al. | |
| 2008/0242082 A1 | 10/2008 | Yang et al. | |

* cited by examiner

*Primary Examiner*—N Drew Richards
*Assistant Examiner*—Kyoung Lee
(74) *Attorney, Agent, or Firm*—Lisa U. Jaklitsch; Katherine S. Brown

(57) ABSTRACT

The invention comprises a copper interconnect structure that includes a noble metal cap with dielectric immediately adjacent the copper/noble metal cap interface recessed from the noble metal cap.

18 Claims, 9 Drawing Sheets

US 7,745,324 B1

INTERCONNECT WITH RECESSED DIELECTRIC ADJACENT A NOBLE METAL CAP

BACKGROUND

The disclosure relates generally to integrated circuits (ICs), and, more particularly, to the fabrication of an interconnect structure with a noble metal cap and recessed dielectric adjacent such noble metal cap.

Electromigration (EM) has long been identified as the major metal failure mechanism. It is a reliability concern for Very Large Scale Integration (VLSI) circuits and manufacturing. EM not only needs to be overcome during process development period in order to qualify the process, but EM also persists through the lift time of the chip. Voids are created inside metal conductors due to metal ion movement caused by high density current flow. Although the fast diffusion path in copper (Cu) interconnects varies depending on the overall integration scheme and materials used for chip fabrication, it has been observed that Cu atom transport along the Cu/post-Chemical Mechanical Polish (CMP) dielectric cap interface plays an important role on EM lifetime projection. More specifically, the EM initiated voids nucleate at the Cu/dielectric cap interface and grow towards the bottom of the interconnect, which eventually results in a dead circuit open. It has been demonstrated that replacing Cu/dielectric cap interface with Cu/metal interface can enhance EM resistance. Observed electrical leakage related yield degradation, however, has delayed implementation of the Cu/metal interface.

BRIEF SUMMARY

A first embodiment of the invention comprises a method of forming an interconnect structure. The embodiment includes the step of depositing a first dielectric layer of ultra low-k material. The embodiment includes the step of forming a sacrificial dielectric layer over the first dielectric layer. The embodiment includes the step of forming an interconnect feature in the sacrificial dielectric layer and first dielectric layer by etching an opening in the sacrificial dielectric layer and first dielectric layer, depositing a liner over the sacrificial dielectric layer and within the opening, overfilling the opening with a conductive material, and, performing a chemical mechanical polishing process to remove a portion of the conductive material, a portion of the liner, and the sacrificial dielectric layer such that top surface of the conductive material filled opening is coplanar with the first dielectric layer. The embodiment includes the step of depositing a noble metal layer on top of the interconnect feature. The embodiment includes the step of annealing the interconnect feature such that an alloy layer forms in the conductive material adjacent the noble metal layer. The embodiment includes the step of removing the noble metal layer and a portion of the first dielectric layer using a gas cluster ion beam, leaving a portion of the liner and the alloy layer protruding from the first dielectric layer. The embodiment includes the step of depositing a second dielectric layer over the first dielectric layer and the protruding liner and alloy layer.

A second embodiment of the invention comprises an interconnect structure. The structure includes a liner layer disposed on an intermediate interconnect feature, the intermediate interconnect feature having an opening etched in a dielectric layer of ultra low-k material, the liner layer protruding from the dielectric layer of ultra low-k material. The structure includes a conductive material disposed on the liner layer, the conductive material filling a portion of the opening. The structure includes an alloy layer disposed on the conductive material, the alloy layer filling remaining portion of the opening, the alloy layer protruding from the dielectric layer of ultra low-k material. The structure includes a dielectric layer disposed on top of the protruding liner, alloy layer, and dielectric layer of ultra low-k material.

BRIEF DESCRIPTION OF THE SEVERAL VIEWS OF THE DRAWINGS

The features and the element characteristics of the invention are set forth with particularity in the appended claims. The figures are for illustrative purposes only and are not drawn to scale. Furthermore, like numbers represent like features in the drawings. The invention itself, however, both as to organization and method of operation, may best be understood by reference to the detailed description which follows, taken in conjunction with the accompanying figures, in which:

DETAILED DESCRIPTION

The invention will now be described with reference to the accompanying figures. In the figures, various aspects of the structures have been depicted and schematically represented in a simplified manner to more clearly describe and illustrate the invention.

By way of overview and introduction, the embodiments of the invention are directed to a interconnect structure with a conductive material/noble metal cap interface. The dielectric adjacent the conductive material/noble metal cap interface is recessed such that the top of the noble metal cap protrudes above the recessed dielectric. A dielectric layer covers the interconnect with the conductive material/noble metal cap interface, as well as the recessed dielectric. A gas cluster ion beam (GCIB) process is used to create the recessed dielectric.

A gas cluster ion beam (GCIB) process, historically, has not been used for an etching process in semiconductor related applications. Historically, the GCIB process was used for surface treatments and to make substrate thicknesses optically uniform. With process optimization, the present embodiment evaluates the GCIB process as an alternative etching process for semiconductor related applications. With process optimization, the present embodiment has discovered that GCIB has improved selectivity as compared with conventional etching processes.

Figure 1:
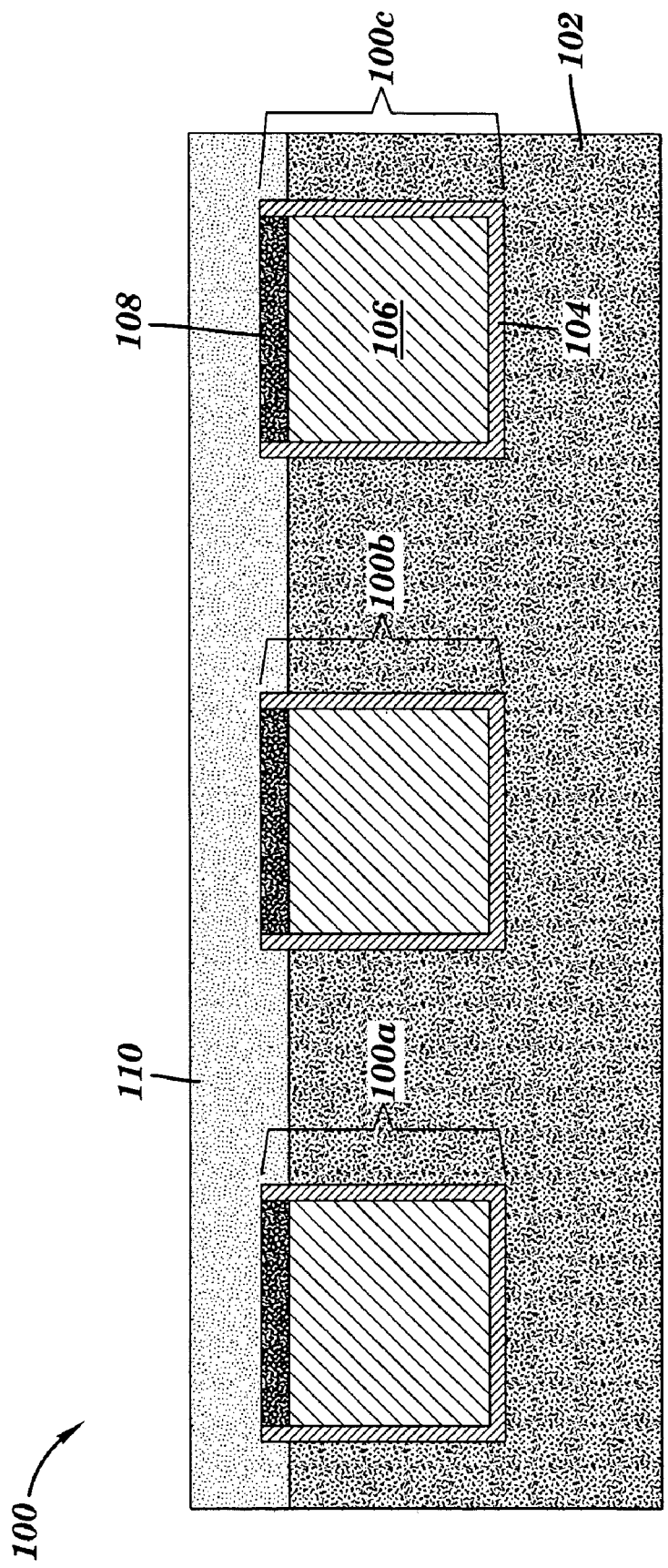
FIG. 1 depicts an embodiment of the invention.

With reference now to FIG. 1, FIG. 1 depicts an embodiment of the invention. As depicted, three interconnects 100a, 100b, 100c are depicted in FIG. 1. The interconnects 100a, 100b, 100c are embedded partially in dielectric layer 102. Dielectric layer 102 comprises an ultra low-k material, such as a porous or dense ultra-low k dielectric with a k value less than or equal to 4.0. A portion of the interconnects 100a, 100b, 100c protrudes above the dielectric layer of ultra-low k material 102 or in other words the dielectric layer of ultra-low k material 102 is recessed from the interconnects 100a, 100b, 100c. The depicted interconnects 100a, 100b, 100c protrude approximately 2 A to 100 A above the dielectric layer of ultra-low k material 102. The interconnects 100a, 100b, 100c include a liner layer 104, which has a thickness in the range of 10 A to 200 A. The liner layer 104 originates from any of the following materials: tantalum nitride (TaN), titanium nitride (TiN), ruthenium (Ru), and tungsten nitride (WN), iridium (IR) or combinations of any of these materials. The purpose of the liner layer 104 is to prevent conductive material 106 from diffusing into dielectric 102. A portion of the liner layer 104 of the interconnects 100a, 100b, 100c extends above the dielectric layer of ultra-low k material 102 by a height of approximately 2 A to 100 A. The interconnects 100a, 100b, 100c are filled with conductive material 106, such as copper (Cu), aluminum (Al) or alloys thereof. Further, as depicted in FIG. 1, an alloy layer 108 fills surface of the interconnects 100a, 100b, and 100c. The alloy layer 108 originates from any of the following materials: ruthenium (Ru), rhodium (Rh), iridium (Ir), cobalt (Co), tungsten (W), platinum (Pt) or alloys of such materials. Consequently, the alloy layer 108 becomes the noble metal cap 108 in interconnects 100a, 100b and 100c. The alloy layer 108 has a thickness ranging from 1 A to 100 A. Finally, a dielectric layer 110 overlays the interconnects 100a, 100b, 100c, as well as the dielectric layer of ultra-low k material 102. The dielectric layer 110 is formed one of silicon nitride ($Si_3N_4$), silicon carbide (SiC), or nitrogen and hydrogen doped silicon carbide (SiC(N,H)). The purpose of the dielectric layer 110 is to act as an etching stop layer for the next level build.

The embodiment of the present invention with the described noble metal cap 108/conductive material 106 interface has better electromigration resistance than a conventional dielectric/conductive material interface. Electromigration resistance is important with respect to high performance related applications. High performance related applications require both high current density and reliability.

The fabrication process for the interconnect 100a, 100b, 100c with the noble metal cap 108 and recessed dielectric 102 is shown in FIGS. 2A-2G.

Figure 2A:
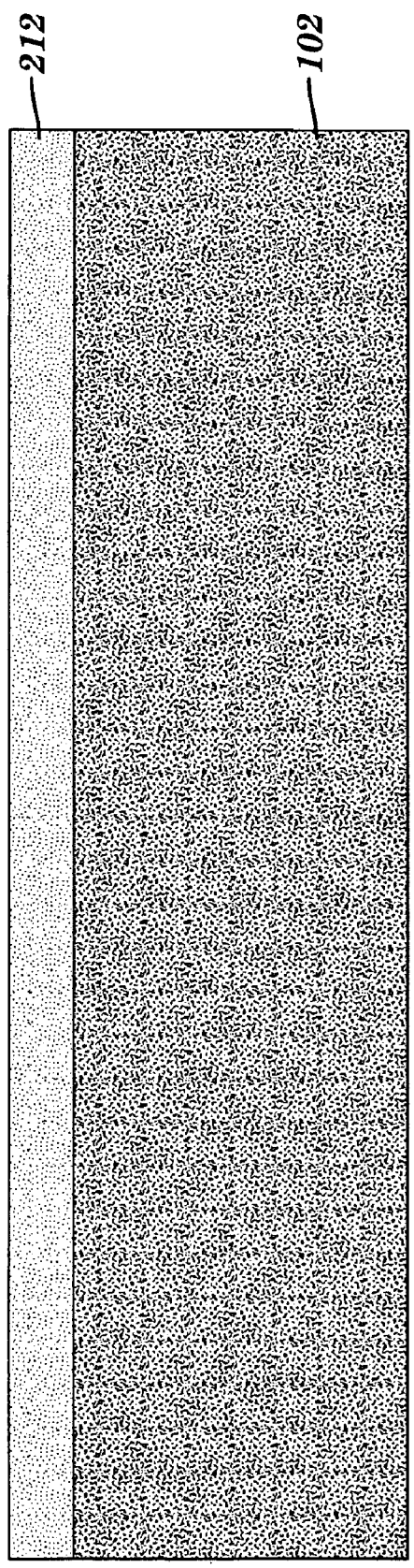
FIGS. 2a-2h depict steps for creation of the embodiment depicted in FIG. 1.

With reference to FIG. 2A, a sacrificial dielectric layer 212, such as silicon dioxide ($SiO_2$), silicon nitride ($Si3N4$), or silicon carbide (SiC) is deposited over the dielectric layer of ultra low-k material 102. The sacrificial dielectric layer 212 functions as a patterning mask. As will be seen in FIG. 2B, the openings that will ultimately form interconnects 100a, 100b, 100c will be etched into both the sacrificial dielectric layer 212 and dielectric layer of ultra low-k material 102.

Figure 2B:
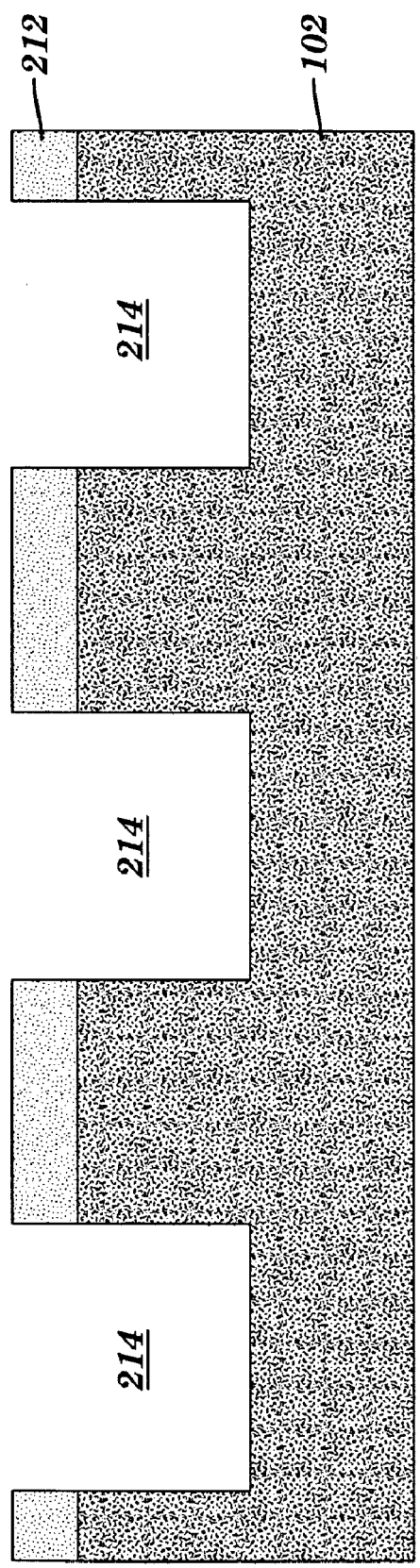

With reference to FIG. 2b, openings 214 which will ultimately form interconnects 100a, 100b, 100c are etched into both the sacrificial dielectric layer 212 and the dielectric layer of ultra-low k material 102. The openings 214 are etched through conventional lithography and etching processes. The etching step used in forming the openings 214 could comprise a dry etching process (including reactive ion etching, ion beam etching, plasma etching or laser ablation), a wet chemical etching process or any combination thereof. Typically, reactive ion etching is used to form the openings 214. Once the openings 214 for the interconnects 100a, 100b, 100c are formed, a conductive material 106 for the interconnects 100a, 100b, 100c will fill the openings 214.

Figure 2C:
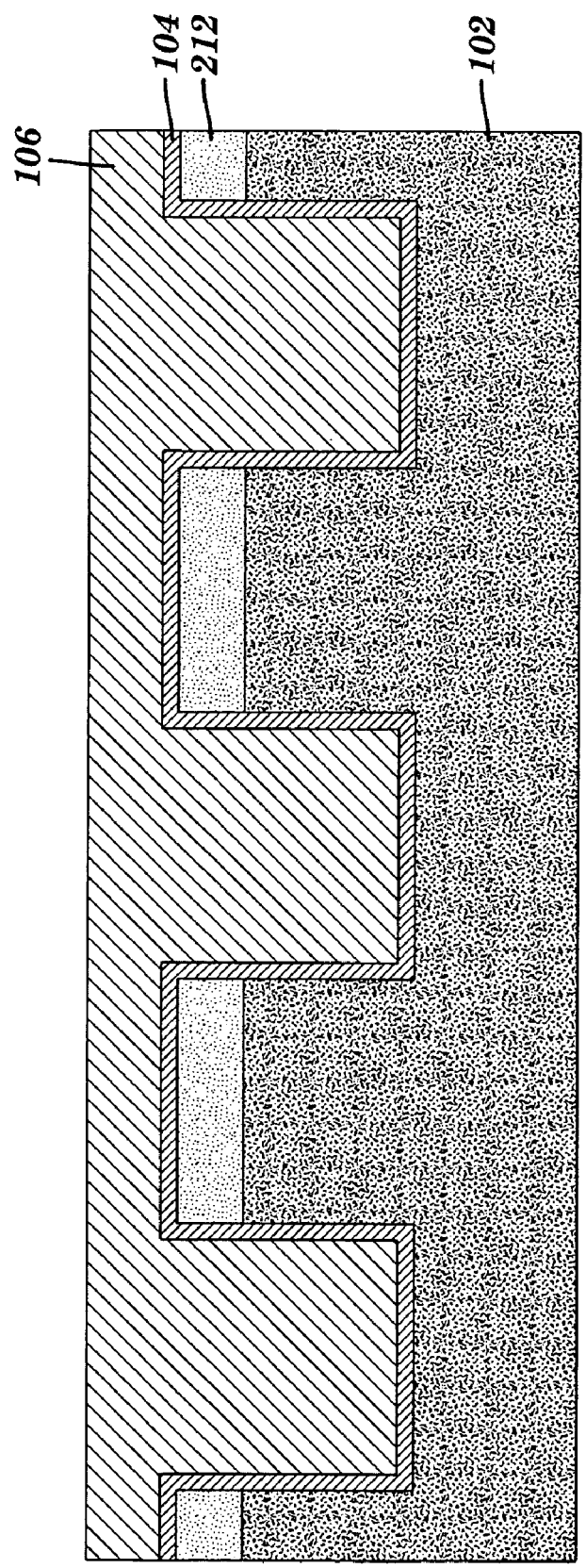

With reference to FIG. 2c, a diffusion barrier liner layer 104 is deposited onto the openings 214 followed by a deposition of a conductive material 106, such as copper, aluminum or alloys of the same. The conductive material 106 overfills the openings 214. In other words, the conductive material 106 fills not just the openings 214, but also blankets the sacrificial dielectric layer 212.

Figure 2D:
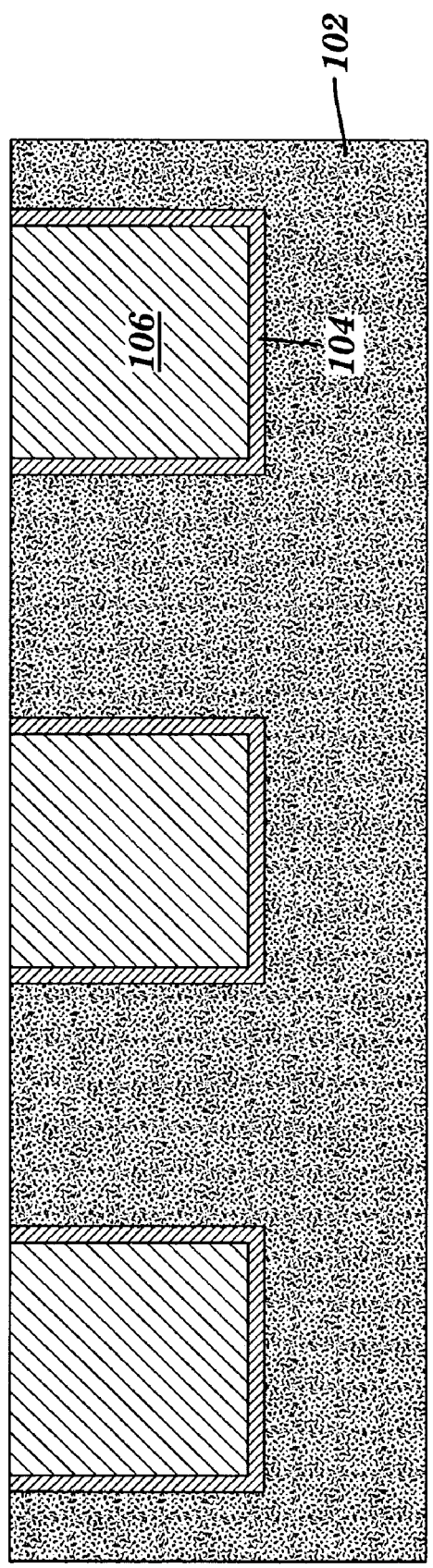

With reference to FIG. 2d, a chemical mechanical polish process removes a portion of the conductive material 106, a portion of the liner layer 104, and the sacrificial dielectric layer 212 such that the top surface of the conductive material 106 and liner layer 104 in the filled opening 214 is coplanar with the dielectric layer of ultra-low k material 102.

Figure 2E:
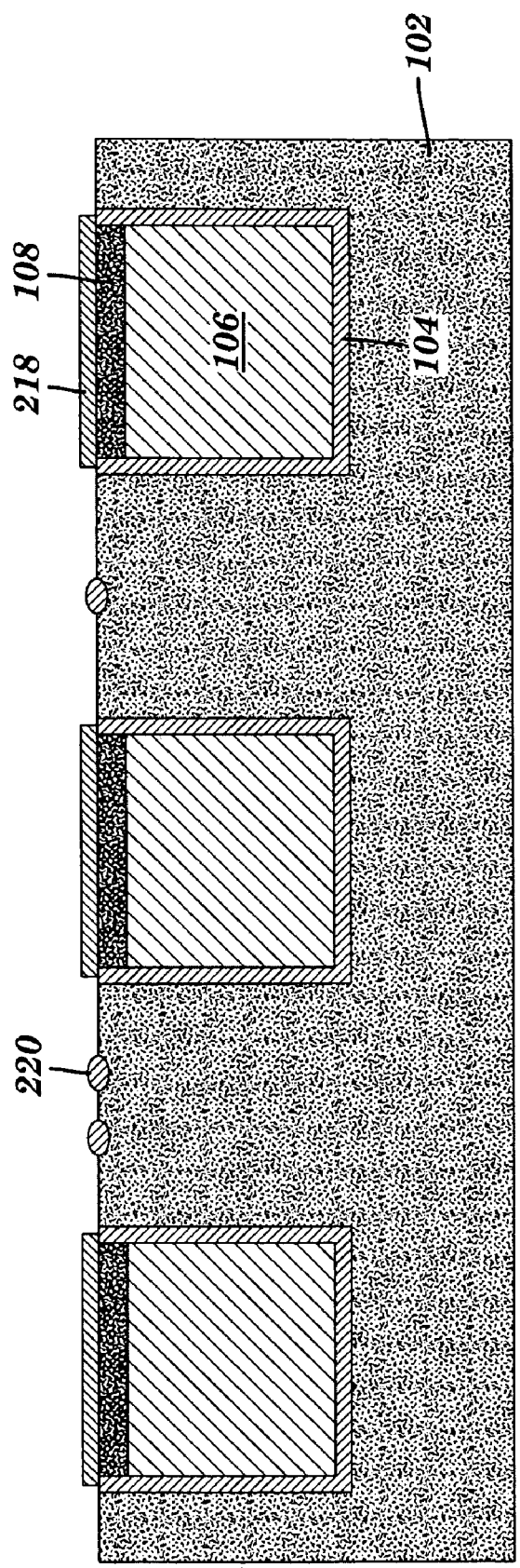

With reference to FIG. 2e, a noble metal layer 218 is selectively deposited on top of interconnects 100a, 100b, 100c, and then annealed. The noble metal layer 218 is deposited by a chemical vapor deposition, atomic layer deposition, electroless plating or an electro plating technique. The material for the noble metal layer 218 is selected from a group consisting of ruthenium (Ru), rhodium (Rh), iridium (Ir), cobalt (Co), tungsten (W), platinum (Pt) or alloys thereof. The deposition of a noble metal layer 218 could leave behind metallic residues 220 on top of the dielectric surface 102. Such metallic residues 220 are problematic because the metallic residues degrade leakage yield and cause reliability related concerns. The annealing process causes an alloy layer 108 to form between the noble metal layer 218 and the conductive material 106. The alloy layer 108 is the noble metal cap 108 in the final interconnect structures 100a, 100b, 100c. The annealing process can be performed in a $H_2/N_2$ ambient at 100~250° C. for 1~5 hours.

Figure 2F:
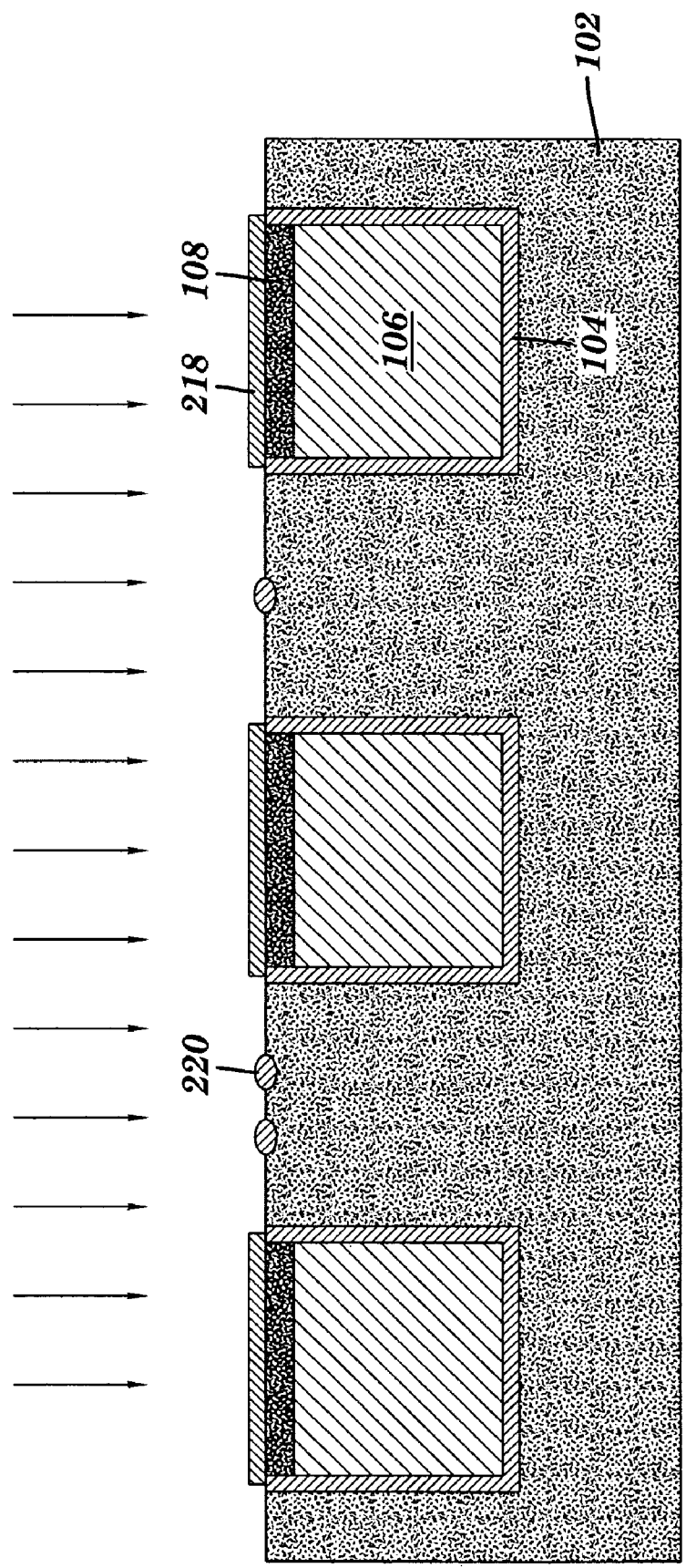

With reference to FIG. 2f, the noble metal layer 218 and a portion of the dielectric layer of ultra-low k material 102 is selectively removed through use of a Gas Cluster Ion Beam (GCIB) process. The optimized gas cluster ion beam contains a concentration of nitrogen trifloride ($NF_3$) and nitrogen ($N_2$) of which the nitrogen trifloride ($NF_3$) concentration is between 0.1% and 20.0% of total gas cluster ion beam concentration. The energy of the optimized gas cluster ion beam is between 0.1 keV and 40.0 keV. In addition to removing the metallic residues 220 caused by deposition of the noble metal layer 218 respectively, the GCIB process also removes the noble metal layer 218 and a portion of the dielectric layer of ultra-low k material 102 as will be depicted in FIGS. 2g and 2h. The GCIB etching process has selectivity better than 5 between noble metal layer 218 and alloy layer 108. In other words, the selective GCIB etching process, etches the noble metal layer 218 at an etching rate that is at least five times faster that the GCIB etching process etches the alloy layer 108.

Figure 2G:
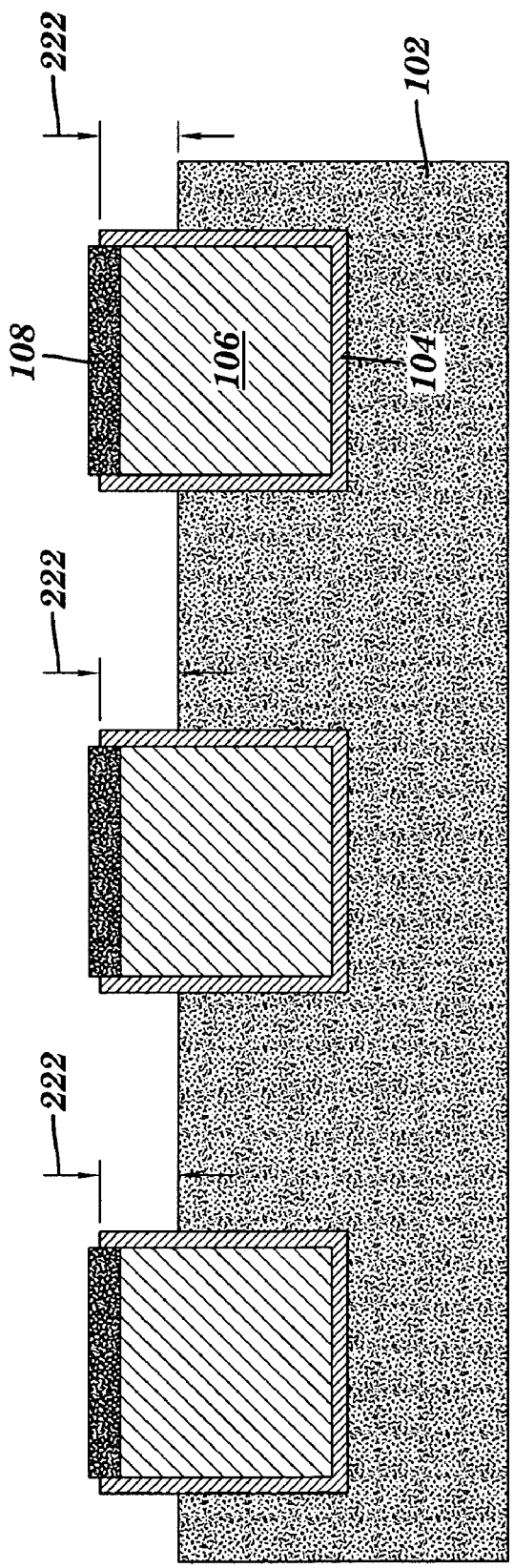
Figure 2H:
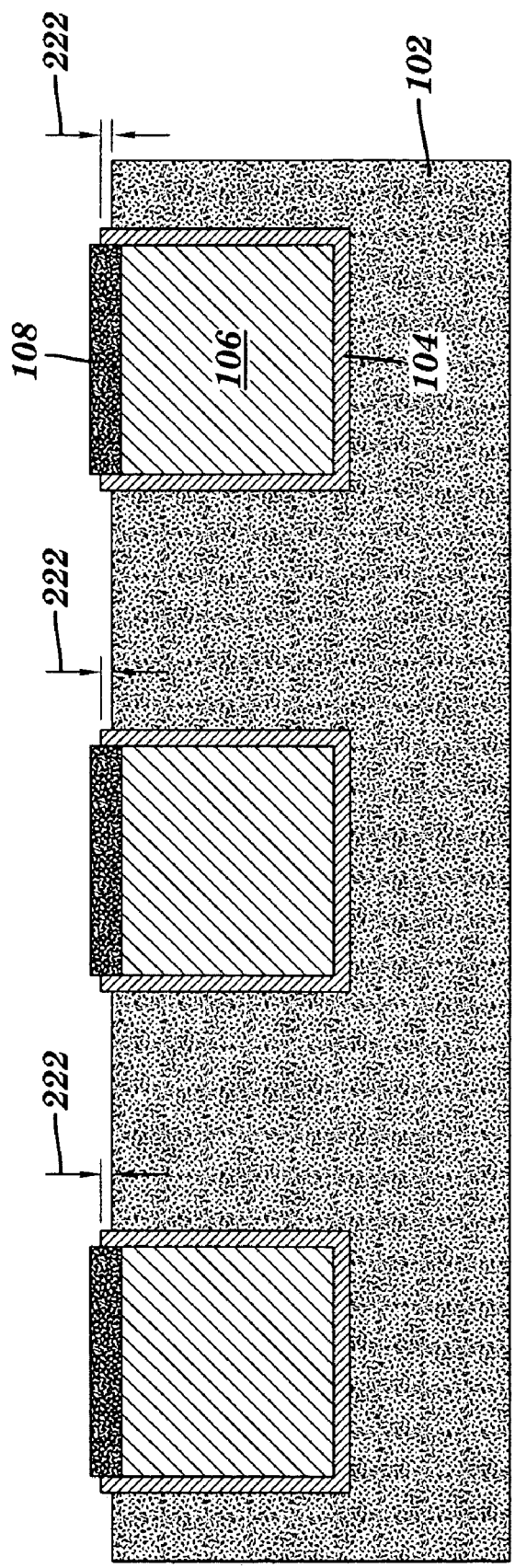

With reference to FIGS. 2g and 2h, the results of the GCIB process are depicted. As shown, the GCIB process recessed the dielectric layer of ultra-low k material 102, such that the top of the alloy layer 108 protrudes above the recessed dielectric 102. FIG. 2g depicts an aggressive recess by which the dielectric layer of ultra-low k material 102 is below the conductive material 106. FIG. 2h, on the other hand, depicts a less aggressive recess, by which the dielectric layer of ultra-low k material 102 is above the conductive material 106. In either recess model depicted in FIGS. 2g and 2h, the alloy layer 108 protrudes at some height 222 above the dielectric layer of ultra-low k material 102. As shown, the GCIB has removed the metallic residues 220, which consequently prevents leakage problems between adjacent interconnects. The liner layer 104 and the alloy layer 108 protrude from the interconnects 100a, 100b, 100c with a height 222 of between 2 A and 100 A. The alloy layer 108 is the noble metal cap 108 for interconnects 100a, 100b, 100c. In a final step, a dielectric layer 110 is deposited over the dielectric layer of ultra-low k material 102 and protruding liner layer 104 and alloy layer 108 through use of a chemical vapor deposition process. The final structure is depicted as shown in FIG. 1.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of forming an interconnect structure, comprising:
   depositing a first dielectric layer of ultra low-k material;
   forming a sacrificial dielectric layer over said first dielectric layer;
   forming an interconnect feature in said sacrificial dielectric layer and first dielectric layer by:
   etching an opening in said sacrificial dielectric layer and first dielectric layer;
   depositing a liner over said sacrificial dielectric layer and within said opening;
   overfilling said opening with a conductive material; and,
   performing a chemical mechanical polishing process to remove a portion of said conductive material, a portion of said liner, and said sacrificial dielectric layer such that top surface of said conductive material filled opening is coplanar with said first dielectric layer;
   depositing a noble metal layer on top of said interconnect feature;
   annealing said interconnect feature such that an alloy layer forms in said conductive material adjacent said noble metal layer;
   removing said noble metal layer and a portion of said first dielectric layer using a gas cluster ion beam, leaving a portion of said liner and said alloy layer protruding from said first dielectric layer; and,
   depositing a second dielectric layer over said first dielectric layer and said protruding liner and alloy layer.

2. A method as in claim 1, wherein said sacrificial dielectric material layer is formed from a material selected from a group consisting of silicon dioxide ($SiO_2$), silicon nitride ($Si_3N_4$), and silicon carbide (SiC).

3. A method as in claim 1, wherein said noble metal layer is deposited by a method selected from a group consisting of chemical vapor deposition (CVD), atomic layer deposition (ALD), electroless plating and electro plating techniques.

4. A method as in claim 1, wherein said noble metal layer is selected from a group consisting of ruthenium (Ru), rhodium (Rh), iridium (Ir), cobalt (Co), tungsten (W), platinum (Pt) and alloys thereof.

5. A method as in claim 1, wherein said gas cluster ion beam contains a concentration of nitrogen trifloride ($NF_3$) and nitrogen ($N_2$).

6. A method as in claim 5, wherein said nitrogen trifloride ($NF_3$) concentration is between 0.1% and 20.0% of total gas cluster ion beam concentration.

7. A method as in claim 1, wherein said gas cluster ion beam has an energy greater than 0.1 keV and less than 40.0 keV.

8. A method as in claim 1, wherein said gas cluster ion beam etches said noble metal layer at a rate that is at least five (5) times faster than said gas cluster beam etches said alloy layer.

9. A method as in claim 1, wherein said second dielectric layer is deposited by chemical vapor deposition (CVD).

10. An interconnect structure, comprising:
    a liner layer disposed on an intermediate interconnect feature, said intermediate interconnect feature having an opening etched in a dielectric layer of ultra low-k material, said liner layer protruding from said dielectric layer of ultra low-k material;
    a conductive material disposed on said liner layer, said conductive material selected from a group consisting of copper (Cu), aluminum (Al) and alloys thereof, said conductive material filling a portion of said opening;
    an alloy layer disposed on said conductive material, said alloy layer comprising a noble metal and said conductive material, said alloy layer filling remaining portion of said opening, said alloy layer protruding from said dielectric layer of ultra low-k material; and,
    a dielectric layer disposed on top of said protruding liner layer, alloy layer, and dielectric layer of ultra low-k material.

11. A structure as in claim 10, wherein said liner layer is selected from a group consisting of tantalum nitride (TaN), titanium nitride (TiN), ruthenium (Ru), and tungsten nitride (WN), iridium (Ir) and combinations thereof.

12. A structure as in claim 10, wherein said liner layer has a thickness ranging from 10 A to 200 A.

13. A structure as in claim 10, wherein said liner layer protrudes from said dielectric layer of ultra low-k material by a height ranging from 2 A to 100 A.

14. A structure as in claim 10, wherein dielectric layer of ultra low-k material is formed from a material selected from a group consisting of porous and dense ultra-low k dielectrics.

15. A structure as in claim 10, wherein said alloy layer comprises a material selected from a group consisting of ruthenium (Ru), rhodium (Rh), iridium (Ir), cobalt (Co), tungsten (W), platinum (Pt) and alloys thereof.

16. A structure as in claim 10, wherein said alloy layer has a thickness ranging from approximately 1.0 A to approximately 100.0 A.

17. A structure as in claim 10, wherein said alloy layer protrudes from said dielectric layer of ultra low-k material by a height ranging from approximately 2.0 A to approximately 100 A.

18. A structure as in claim 10, wherein said dielectric layer is formed from a material selected from a group consisting of silicon nitride ($Si_3N_4$), silicon carbide (SiC), and nitrogen and hydrogen doped silicon carbide (SiC(N,H)).

* * * * *